(12) United States Patent
Gidon et al.

(10) Patent No.: US 7,505,394 B2
(45) Date of Patent: Mar. 17, 2009

(54) FLEXIBLE MEMBRANE COMPRISING NOTCHES

(75) Inventors: Serge Gidon, La Murette (FR); Olivier Lemonnier, La Terrasse (FR)

(73) Assignee: Commissariat a l'Energie Atomique, Paris (FR)

( * ) Notice: Subject to any disclaimer, the term of this patent is extended or adjusted under 35 U.S.C. 154(b) by 404 days.

(21) Appl. No.: 10/593,976

(22) PCT Filed: Mar. 25, 2005

(86) PCT No.: PCT/FR2005/000716

§ 371 (c)(1),
(2), (4) Date: Sep. 22, 2006

(87) PCT Pub. No.: WO2005/098845

PCT Pub. Date: Oct. 20, 2005

(65) Prior Publication Data

US 2007/0211612 A1    Sep. 13, 2007

(30) Foreign Application Priority Data

Apr. 1, 2004   (FR) .................................. 04 03432

(51) Int. Cl.
*G11B 3/70*   (2006.01)

(52) U.S. Cl. ......................................... 369/287; 369/126
(58) Field of Classification Search .................... None
See application file for complete search history.

(56) References Cited

U.S. PATENT DOCUMENTS

| | | | | |
|---|---|---|---|---|
| 5,216,631 A * | 6/1993 | Sliwa, Jr. ..................... 365/174 |
| 5,554,851 A | 9/1996 | Hirai et al. |
| 6,522,566 B2 | 2/2003 | Carter |
| 6,762,543 B1 * | 7/2004 | Kang et al. ................... 313/311 |
| 2005/0269653 A1 | 12/2005 | Gidon |

FOREIGN PATENT DOCUMENTS

| | | |
|---|---|---|
| JP | A 6-333276 | 12/1994 |
| WO | WO 89/08489 | 9/1989 |
| WO | WO 2004/032132 A2 | 4/2004 |

* cited by examiner

*Primary Examiner*—Paul Huber
(74) *Attorney, Agent, or Firm*—Oliff & Berridge, PLC

(57) ABSTRACT

The flexible membrane comprises at least one thin layer with a plurality of indentations formed therein, wherein bearing points for actuating elements are disposed between said indentations in order to locally deform the membrane. The thus open-worked membrane is more flexible in a cross direction. The open-worked membrane can act as a support for the recording data, cooperating with a micro-point bi-dimensional network.

14 Claims, 5 Drawing Sheets

FLEXIBLE MEMBRANE COMPRISING NOTCHES

This application is a 371 of PCT/FR05/00716, filed Mar. 25, 2005.

BACKGROUND OF THE INVENTION

The invention relates to a flexible membrane, in particular a membrane designed to form the storage medium of a data recording device.

STATE OF THE ART

The International Patent application filed by the applicant on 1 Oct. 2003 under the n° PCT/FR2003/002879 proposes using a flexible membrane to form the storage medium of a data recording device. The latter comprises a two-dimensional array of microtips, the apex whereof is generally of nanometric dimensions, arranged in a plane facing the storage medium formed by the flexible membrane, supported by a frame forming a plurality of recesses, each recess being associated with at least one microtip. The flexibility of the membrane enables the heightwise dispersions of the microtips to be compensated. The flexible membrane can be formed by a layer or by a stack of layers of extremely small thickness, ranging from a few nanometers to a few micrometers. It deforms locally under the action of local forces applied perpendicularly to its surface by the microtips, under the control of electronic means for addressing and controlling the microtips, to enable data to be recorded on the storage medium. Very high storage densities can thus be achieved.

It may however be important to reduce the stiffness of the storage medium under the microtips in as far as this is possible, in particular for tribology reasons, without however limiting the dimensional stability of the storage medium in its plane.

OBJECT OF THE INVENTION

The object of the invention is to remedy the above-mentioned shortcomings.

According to the invention, this object is achieved by a flexible membrane according to the appended claims, and more particularly by a flexible membrane comprising at least one thin layer wherein a plurality of notches are formed, pressing points for mechanical actuating elements being located between the notches, the actuating elements being designed to locally deform the membrane with which they come into contact at the pressing points.

According to one development of the invention, the notches are arranged periodically in the plane of the membrane.

According to a preferred embodiment, the notches are arranged in the form of lines and columns each alternately comprising first notches arranged in a first direction and second notches arranged in a second direction that can advantageously be substantially orthogonal to the first direction.

The notches can be linear, T-shaped, H-shaped, or in the form of crenelations, and comprise broadened ends of substantially circular cross-section.

According to a development of the invention, the membrane constitutes a data recording medium designed to cooperate with a two-dimensional array of microtips coming into contact with the membrane at said pressing points.

BRIEF DESCRIPTION OF THE DRAWINGS

Other advantages and features will become more clearly apparent from the following description of particular embodiments of the invention given as non-restrictive examples only and represented in the accompanying drawings, in which.

DESCRIPTION OF PARTICULAR EMBODIMENTS

Figure 1:
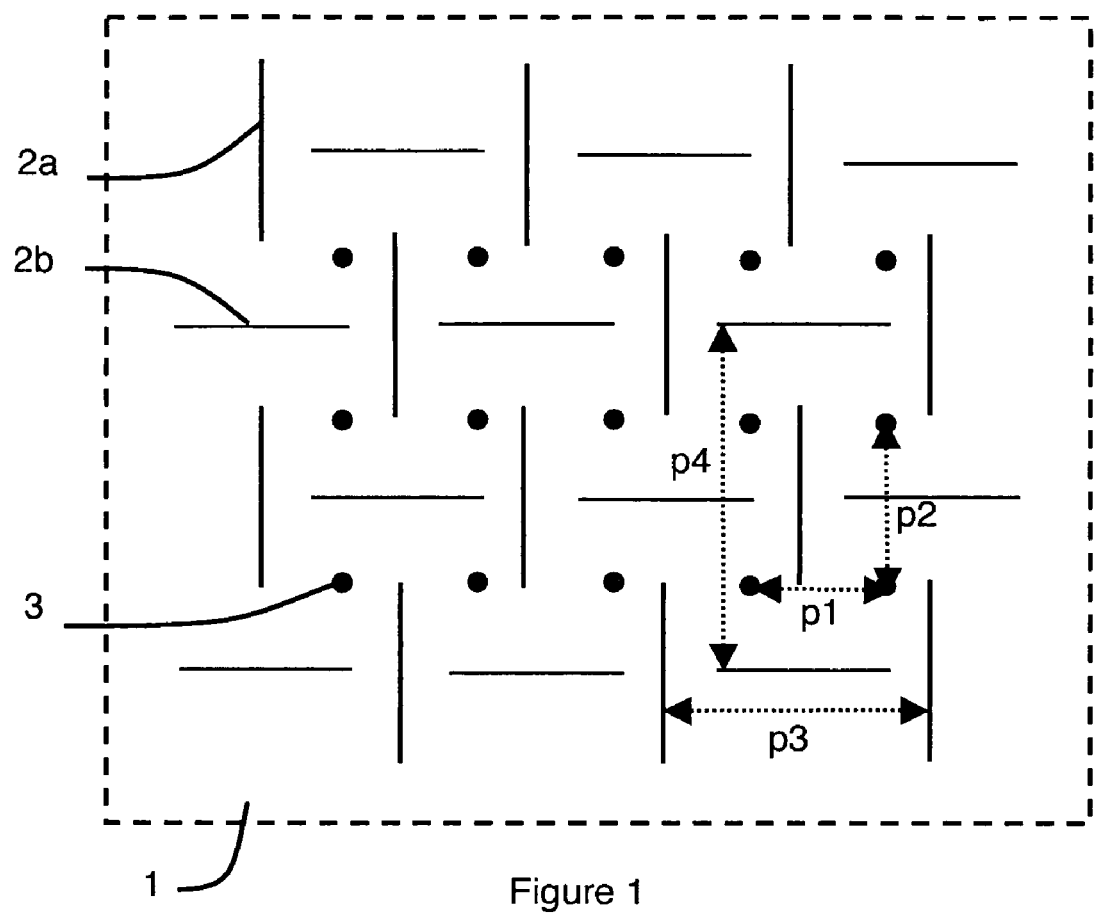
FIG. 1 illustrates a particular embodiment of a flexible membrane according to the invention.

As represented in FIG. 1, a flexible membrane 1 comprises a plurality of notches 2 or grooves in the plane of the membrane 1, between which notches pressing points 3 are arranged for actuating elements designed to deform the membrane 1 locally and selectively.

In a preferred embodiment, the notches 2 pass through the entire thickness of the membrane 1, which membrane may be single-layer or multi-layer.

In FIG. 1, the pressing points 3 form a two-dimensional array of 3 lines and 5 columns with a preset periodicity. The pitch p1 separating two adjacent pressing points 3 of a line can be identical or different from the pitch p2 separating two adjacent pressing points 3 of a column.

The notches 2 are arranged periodically, preferably in at least one direction of the plane of the membrane, i.e. parallel to one another. The notches 2 can also form sub-assemblies arranged in distinct directions in the plane of the membrane 1. In a preferred embodiment, the notches 2a of a first sub-assembly are substantially perpendicular to the notches 2b of a second sub-assembly.

In the particular embodiment illustrated in FIG. 1, the notches 2 are arranged staggered with respect to the pressing points 3, in the form of lines and columns each alternately comprising vertical notches 2a and horizontal notches 2b. The vertical notches 2a of two adjacent columns are thus vertically offset from one another and the pitch p3 separating two adjacent vertical notches 2a of any one line is preferably substantially equal to twice the corresponding pitch p1 separating two adjacent pressing points 3 in the same direction, i.e. horizontally. Likewise, the horizontal notches 2b of two adjacent lines are horizontally offset from one another and the pitch p4 separating two adjacent horizontal notches 2b of any one column is preferably substantially equal to twice the corresponding pitch p2 separating two adjacent pressing points 3 in the same direction, i.e. vertically.

More generally, the lines and columns do not have to be respectively horizontal and vertical. The lines and columns then each alternatively comprise first notches 2a arranged in a first direction and second notches 2b arranged in a second direction. As before, the pitch p3 separating two adjacent first notches 2a of any one line is preferably substantially equal to twice the pitch p1 separating two adjacent pressing points 3 in the second direction, the pitch p4 separating two adjacent second notches 2b of any one column being substantially equal to twice the pitch p2 separating two adjacent pressing points 3 in the first direction.

As a non-restrictive example, the above-mentioned different pitches can be about 100 µm for p1 and p2 and about 200 µm for p3 and p4, the length of the notches being about 120 µm to 150 µm.

The membrane 1 perforated in this way presents a greater flexibility in the transverse direction, without reducing the geometrical precision and quality of the membrane in its plane. The action of an actuating element exerting a force on a pressing point 3 makes the membrane deform transversely to its plane and present tears at the location of the notches 2 adjacent to said pressing point. This enhanced flexibility is greater the longer the notches 2 and the less material the latter leave forming the membrane between these notches. A transverse flexibility limit of the membrane is however constituted by the loss of geometric rigidity of the membrane in its plane. The staggered structure described above enables the ends of the unit patterns to be well secured, preventing surface lifting effects during the membrane fabrication steps consisting in relieving the surfaces.

Although periodic arrangement of the notches, designed to match the pitch of the actuating elements, is preferred, the notches can be arranged in any manner. Structures in the form of square, rectangular (for example illustrated in FIGS. 1 and 2), diamond-shaped, etc. meshes can in particular be used.

Figure 2:
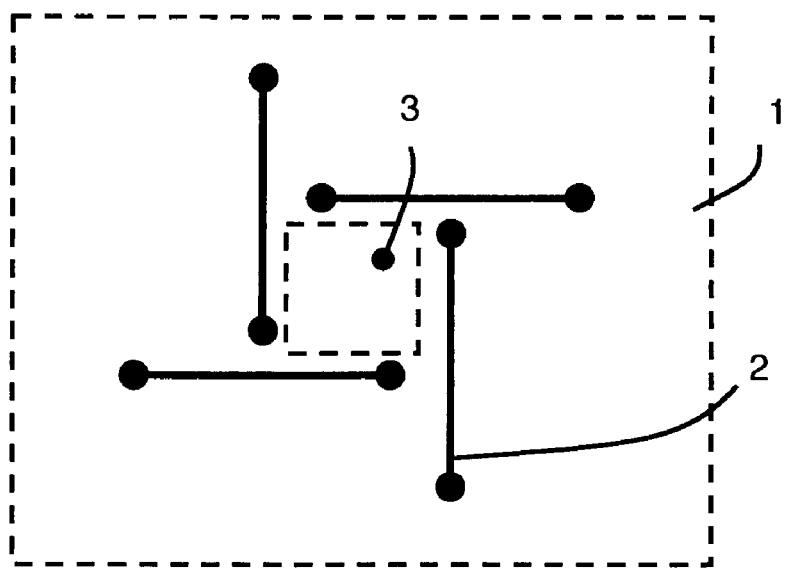
FIGS. 2 to 5 represent a pattern of a flexible membrane according to the invention with different alternative embodiments of the notches.
Figure 3:
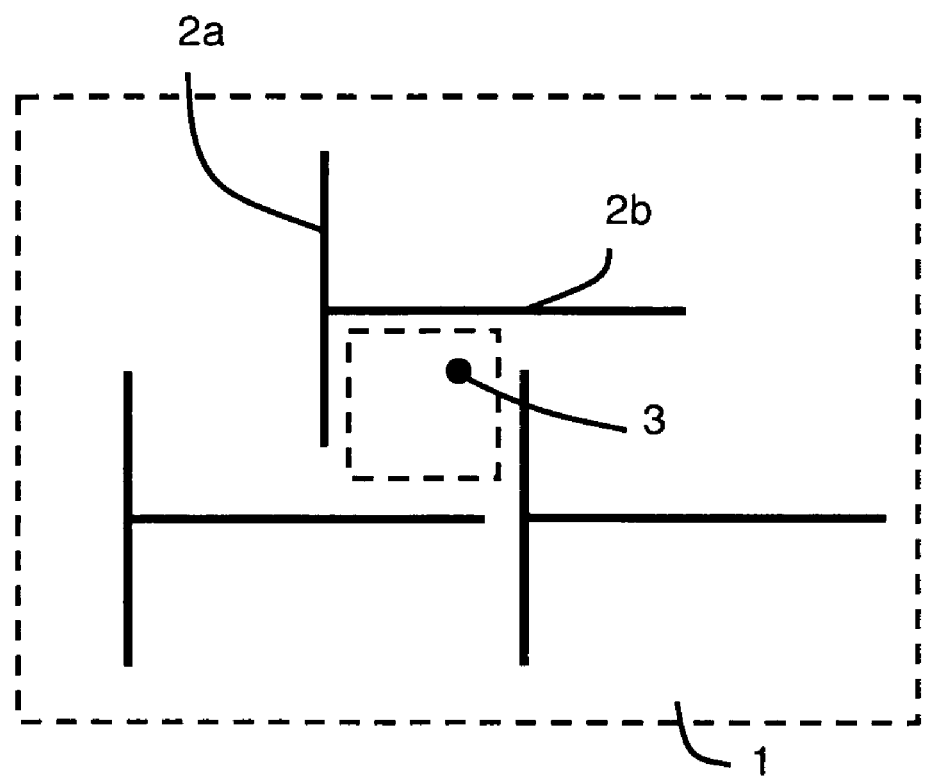
Figure 4:
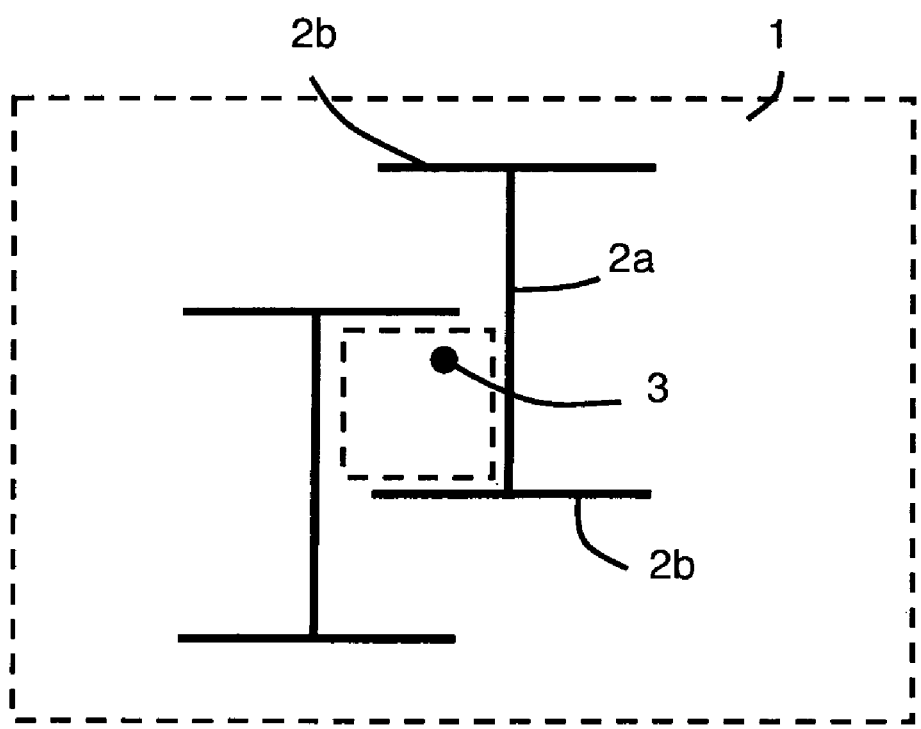
Figure 5:
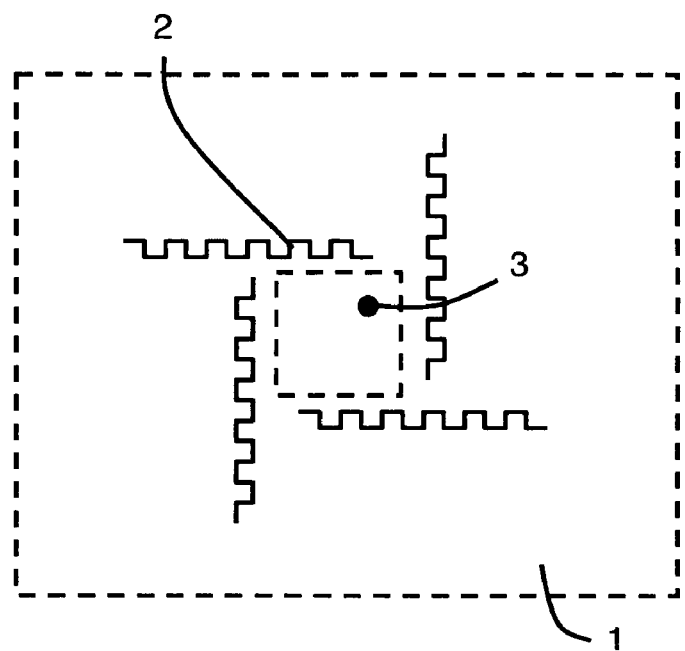

The notches can also be of any shape. For example, the notches can be linear, as represented in FIG. 1, possibly with broadened ends, for example having a substantially circular cross-section, as represented in FIG. 2. Other geometric shapes are possible, in particular T-shaped notches, H-shaped notches, or notches in the form of crenelations, as represented respectively in FIGS. 3 to 5, or by a combination of these shapes on a single membrane. Naturally, broadening of the ends of the notches, illustrated in FIG. 2, can be used whatever the shape of the notch (linear, T-shaped, H-shaped, crenelated etc.). In the particular embodiment represented in FIG. 3, a vertical notch 2a joined to an adjacent horizontal notch 2b of one and the same line form a single complex notch in the shape of a T lying on its side. In like manner, in FIG. 4, two horizontal notches 2b joined by a vertical notch 2a of one and the same column form a single complex notch in the shape of an H on its side.

The number and/or dimensions of the notches are adapted to the minimum rigidity necessary for the membrane to play the role assigned to it.

Figure 6:
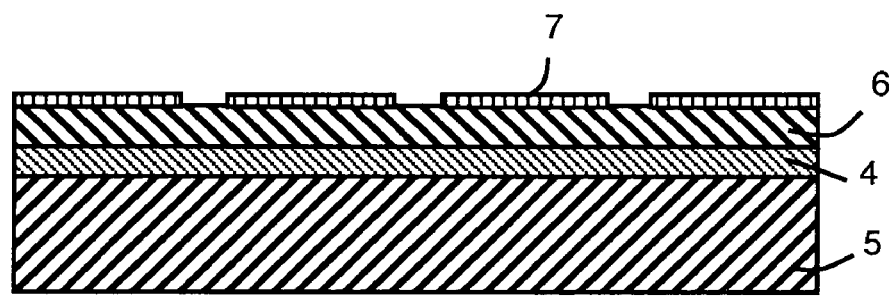
FIGS. 6 to 8 illustrate a particular embodiment of fabrication of a membrane according to the invention.
Figure 7:
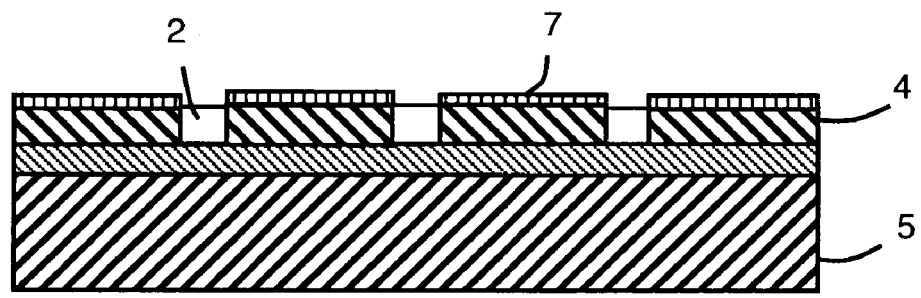
Figure 8:
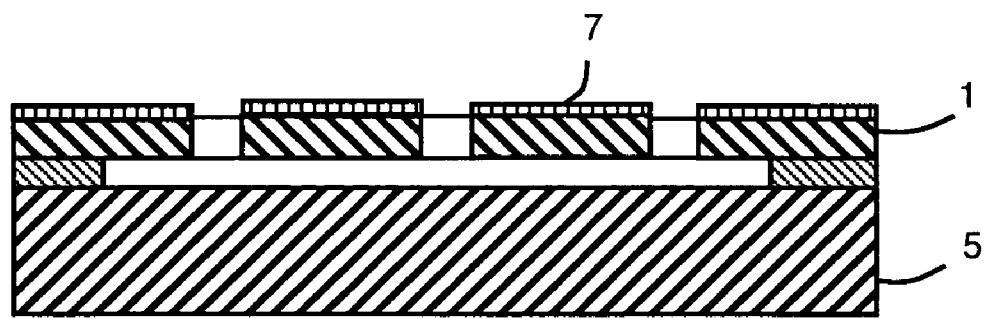

A particular embodiment of fabrication of a perforated membrane is illustrated in FIGS. 6 to 8. A sacrificial layer 4, for example made of silica, is formed on a substrate 5. A layer 6, for example made of silicon nitride, designed to form the membrane 1, is then deposited on the sacrificial layer 4. A mask 7, corresponding to the pattern required for the notches, is formed, for example by photolithography in a photoresist layer deposited on the layer 6 (FIG. 6). The stack of layers 4 to 6 can also be formed by silicon on insulator (SOI), which integrates a silica layer forming an insulator and able to act as sacrificial layer 4. In this case, the silica layer may, in known manner, also perform a function of separating layer with possible transfer of the membrane for assembly according to the Smartcut™ technology.

The notches 2 are then formed in the layer 6, by anisotropic etching, preferably up to the level of the sacrificial layer 4 of silica (FIG. 7). This anisotropic etching can be performed, in known manner, by ion bombardment or by selective chemical etching, for example by potassium hydroxide (KOH) if the layer constituting the membrane is made of silicon.

The sacrificial layer 4 is then etched with hydrofluoric acid, for example by selective isotropic etching in aqueous phase, via the notches 2 (FIG. 8). The membraned structure is thus relieved, by isotropic chemical etching stopped after a preset time that is sufficiently long to release the membrane. The latter remains fixed to the substrate 5 via the remaining part of the sacrificial layer 4, constituting a support frame for the membrane. The photoresist mask can then be removed, in known manner, and additional layers of the membrane can then be deposited, if required, on the etched and released membrane.

The perforated flexible membrane 1 according to the invention can be used in all structures with flexible membranes requiring a great transverse flexibility and more particularly in all structures wherein a flexible membrane is designed to cooperate with a mechanical actuating structure pressing on the membrane at a certain number of pressing points 3, which can be mobile in the plane of the membrane.

Figure 9:
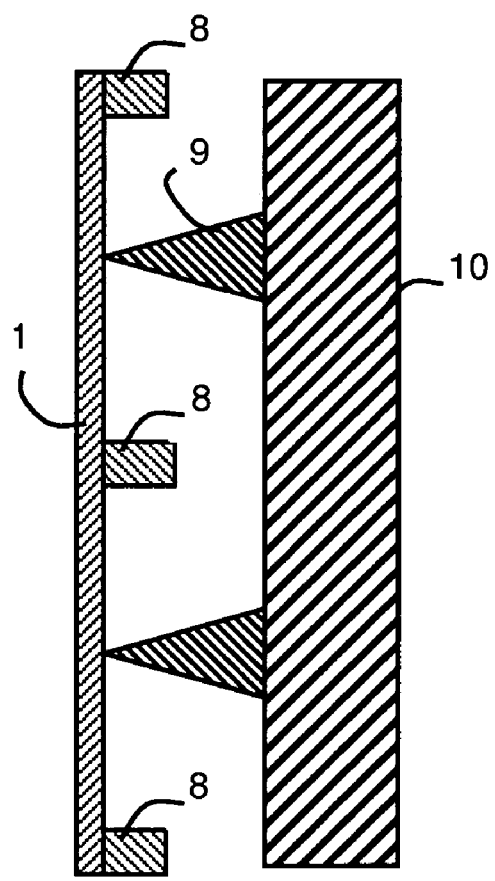
FIGS. 9 and 10 illustrate the use of a membrane according to the invention in microtip-based data recording devices.

A perforated membrane 1 can in particular be used as storage medium in the computer field or in the multimedia field. The membrane then acts as data recording medium cooperating with a two-dimensional microtips array. In this case, as described in the above-mentioned patent application PCT/FR2003/002879 and as represented in FIG. 9, the flexible membrane 1 can be supported by a frame 8 forming a plurality of adjacent recesses. Each recess then cooperates with at least one microtip 9. The two-dimensional microtips array is for example formed on a base 10 arranged facing the membrane 1, parallel to the latter. A relative movement of the microtips 9 and of the membrane 1 constituting the storage medium can be transmitted to the membrane and/or to the microtips by actuators (not shown), themselves controlled by a microcomputer. Control and addressing or multiplexing of the microtips 9 in read or write position is performed by any suitable means, preferably by an electronic circuit achieved in the base 10 by integrated technology. Use of the perforated membrane according to the invention not only enables any heightwise differences of the microtips and any deformations of the base supporting the microtips to be compensated, but also enables the pressing force of the microtips on the membrane 1 to be reduced.

Figure 10:
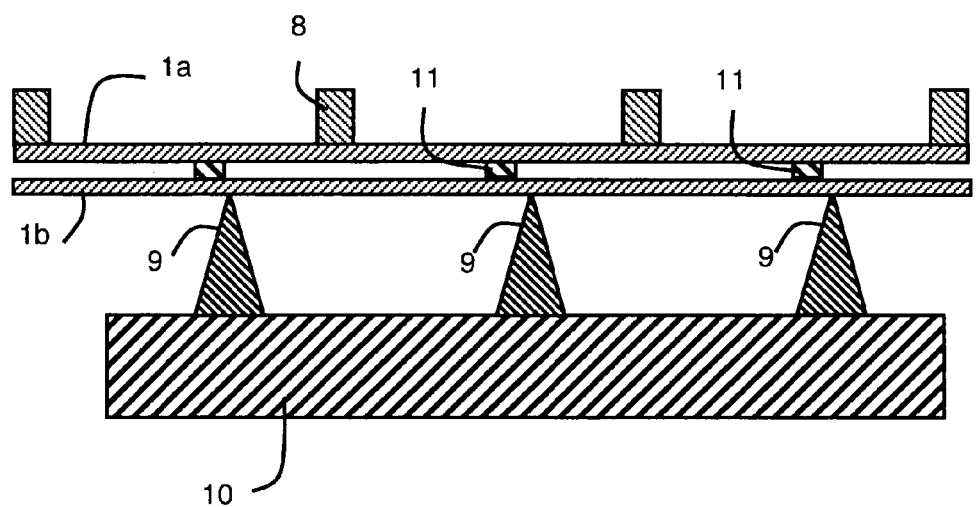

The perforated flexible membrane 1 described above can also be used to form unit membranes 1a and 1b in a data recording device of the type described in the above-mentioned patent application PCT/FR2003/002879 and represented in FIG. 10. The particular embodiment represented in FIG. 10 enables the edge effects related to use of a frame to be limited. In this device, the flexible membrane comprises a first unit membrane 1a, associated with the frame 8 as in FIG. 9, and a second unit membrane 1b designed to come into contact with the microtips array 9. The two unit membranes 1a and 1b are separated by an lattice array of spacing elements 11, which array is laterally offset with respect to the frame 8. The spacing elements 11 have a sufficient thickness to prevent contact between the two unit membranes when deformation thereof takes place.

The perforated membrane according to the invention can also be used, pressing on dots, in the adaptative optics field or to achieve deformable mirror spatial modulators. In this case advantage is taken of the flexibility provided by the notches 2 to facilitate swivelling of elements of a mirror, constituted by the membrane, by means of an array of actuators, the membrane then comprising a reflecting layer.

The invention claimed is:

1. A Flexible membrane comprising at least one thin layer wherein a plurality of notches are formed, pressing points for mechanical actuating elements being located between the notches, the actuating elements being designed to locally deform the membrane with which they come into contact at the pressing points.

2. Membrane according to claim 1, wherein the notches pass through the entire thickness of the membrane.

3. Membrane according to claim 1, wherein the notches are arranged periodically in the plane of the membrane.

4. Membrane according to claim 1, wherein the notches are parallel to one another.

5. Membrane according to claim 1, comprising first and second sub-assembles of notches arranged in different directions in the plane of the membrane.

6. Membrane according to claim 5, wherein the notches of the first sub-assembly are substantially perpendicular to the notches of the second sub-assembly.

7. Membrane according to claim 1, wherein the arrangement of the notches is periodic.

8. Membrane according to claim 1, wherein the notches are staggered with respect to the pressing points.

9. Membrane according to claim 8, wherein the notches are arranged in the form of lines and columns each alternately comprising first notches in a first direction and second notches in a second direction.

10. Membrane according to claim 9, wherein the second direction is substantially orthogonal to the first direction.

11. Membrane according to claim 9, wherein a pitch separating two adjacent first notches of a line is substantially equal to twice the pitch separating two adjacent pressing points in the second direction, and that the pitch separating two adjacent second notches of a column is substantially equal to twice the pitch separating two adjacent pressing points in the first direction.

12. Membrane according to claim 1, wherein the notches are linear, T-shaped, H-shaped or in the form of crenelations.

13. Membrane according to claim 12, wherein the notches comprise broadened ends of substantially circular cross-section.

14. Membrane according claim 1, wherein the membrane constitutes a data recording medium designed to cooperate with a two-dimensional array of microtips coming into contact with the membrane at said pressing points.

* * * * *